US012351934B2

(12) United States Patent
Yu et al.

(10) Patent No.: US 12,351,934 B2
(45) Date of Patent: Jul. 8, 2025

(54) MANUFACTURING METHOD AND APPARATUS FOR ELECTRONIC COMPONENT

(71) Applicant: SUZHOU MAXWELL TECHNOLOGIES CO., LTD., Suzhou (CN)

(72) Inventors: Cao Yu, Suzhou (CN); Gangqiang Dong, Suzhou (CN)

(73) Assignee: SUZHOU MAXWELL TECHNOLOGIES CO., LTD., Suzhou (CN)

( * ) Notice: Subject to any disclaimer, the term of this patent is extended or adjusted under 35 U.S.C. 154(b) by 0 days.

(21) Appl. No.: 18/634,733

(22) Filed: Apr. 12, 2024

(65) Prior Publication Data
US 2024/0254646 A1 Aug. 1, 2024

Related U.S. Application Data

(63) Continuation of application No. PCT/CN2023/080292, filed on Mar. 8, 2023.

(30) Foreign Application Priority Data

Apr. 24, 2022 (CN) .................. 202210433668.X

(51) Int. Cl.
*C25D 5/06* (2006.01)
*C25D 3/38* (2006.01)
(Continued)

(52) U.S. Cl.
CPC ................ *C25D 5/06* (2013.01); *C25D 3/38* (2013.01); *C25D 7/126* (2013.01); *C25D 17/001* (2013.01);
(Continued)

(58) Field of Classification Search
CPC .. C25D 7/12–126; C25D 17/001; C25D 5/06; H01L 21/2885; H01L 21/76873; H01L 2224/11462
See application file for complete search history.

(56) References Cited

U.S. PATENT DOCUMENTS 4,800,001 A * 1/1989 Ott .................. H05K 3/241
204/224 R

FOREIGN PATENT DOCUMENTS

| CN | 211311658 U | 8/2020 |
|---|---|---|
| CN | 112575351 A | 3/2021 |
| CN | 114318471 A | 4/2022 |

* cited by examiner

*Primary Examiner* — Hosung Chung
(74) *Attorney, Agent, or Firm* — George D. Morgan

(57) ABSTRACT

The disclosure discloses a manufacturing method and apparatus for an electronic component, and belongs to the technical field of manufacture of photovoltaic devices. The manufacturing method includes: putting a semiconductor device into a cathode region, and driving the semiconductor device to move in the cathode region, at the same time, connecting line plating rollers to a power source, and driving the line plating rollers to rotate, so that a surface of the semiconductor device is plated with metal lines in a movement direction thereof by conductive parts located in a circumferential direction of an outer side of each of the line plating rollers; the conductive parts include line plating regions and deplating regions; an anode is disposed on outer sides of the deplating regions and is electrically connected to a positive electrode of the power source by the conductive parts in the deplating regions.

15 Claims, 5 Drawing Sheets

(51) Int. Cl.
*C25D 7/12* (2006.01)
*C25D 17/00* (2006.01)
*C25D 21/11* (2006.01)
*H01L 21/288* (2006.01)

(52) U.S. Cl.
CPC ............ *C25D 17/005* (2013.01); *C25D 21/11* (2013.01); *H01L 21/2885* (2013.01)

MANUFACTURING METHOD AND APPARATUS FOR ELECTRONIC COMPONENT

CROSS-REFERENCE TO RELATED APPLICATIONS

The application claims priority to Chinese patent application No. 202210433668X, filed on Apr. 24, 2022, the entire contents of which are incorporated herein by reference.

TECHNICAL FIELD

The present disclosure belongs to the technical field of manufacture of photovoltaic devices, and more particularly relates to a manufacturing method and apparatus for an electronic component.

BACKGROUND

Currently, grid lines plated in the photovoltaic industry mainly include silver grid lines, copper grid lines, nickel grid lines, mixed grid lines, etc. The copper grid lines are mainly formed by means of copper electroplating and light induction, and copper plating methods mainly include a rack plating method, a horizontal continuous plating method, etc. At present, the rack plating method has been adopted in most of electroplating in the photovoltaic industry. However, when the rack plating method is adopted in the current photovoltaic industry, problems such as rack marks and insufficient surface finish will be generally caused, the production capacity cannot be released, and the automation degree of equipment is low. Moreover, during rack plating, a lot of labor is needed for racking and unracking, and therefore, the production efficiency is low; the rack plating method is low in finished product ratio, which is mainly caused by poor line plating thickness uniformity, poor bottom layer binding force, high brittleness, etc.; and the rack plating method is nonuniform in thickness and greater in thickness difference of a near clamping point region and a far clamping point region, which directly affects the efficiency of a battery slice. In order to ensure the uniformity of the line plating thickness, there is a solution in which the number of clamping points is increased during electroplating and an average distance from any position of the battery slice to a clamping point is shortened; and there is also a solution in which a horizontal plating method is adopted, and a contact point changes with the movement of the battery slice, so that the line plating uniformity is ensured, at the same time, the contact area can also be increased, and a greater current is withstood. However, during the electroplating of the battery slice, there is copper separated at contact points, and therefore, the contact points need to be cleaned regularly, copper ions in a solution are consumed, or otherwise, the line plating uniformity will be affected, which not only reduces the production efficiency, but also increases the cost. In addition, traditional horizontal plating processes mostly adopt single-sided plating, and are longer in production line, large in device occupation area, and incapable of satisfying the demand of double-sided electroplating, which results in lower production efficiency of an electronic device of which a surface is provided with metal lines.

SUMMARY

1. Problems to be Solved

For a problem that metals are easily residual on a line plating device in the prior art to result in lowering the uniformity of a metal layer, reducing the generation efficiency and increasing the cost, the present disclosure provides a manufacturing method and apparatus for an electronic component. By designing line plating rollers to plate lines on a semiconductor device, the line plating rollers can self-consume the residual metals, thereby effectively solving the problems that plated metals are residual and the uniformity of the metal layer is lowered.

2. Technical Solutions

In order to solve the above-mentioned problems, the present disclosure adopts the following technical solution:
a manufacturing method for an electronic component in the present disclosure is used for plating metal lines on a surface of a semiconductor device, wherein the manufacturing method includes: putting a semiconductor device into a cathode region, and driving the semiconductor device to move in the cathode region, at the same time, connecting line plating rollers to a power source, and driving the line plating rollers to rotate, so that a surface of the semiconductor device is plated with metal lines in a movement direction thereof by conductive parts located in a circumferential direction of an outer side of each of the line plating rollers; the conductive parts include line plating regions and deplating regions; an anode is disposed on outer sides of the deplating regions and is electrically connected to a positive electrode of the power source by the conductive parts in the deplating regions; and the cathode region capable of holding the semiconductor device is disposed on outer sides of the line plating regions, and the semiconductor device is electrically connected to a negative electrode of the power source by the conductive parts in the line plating regions.

A main circuit loop formed in the present disclosure is shown as: the positive electrode of the power source→the conductive parts in the deplating regions→the anode→a plating solution→the semiconductor device (a cathode) →the conductive parts in the line plating regions→the negative electrode of the power source→the positive electrode of the power source.

It should be noted that the line plating regions and the deplating regions in the present disclosure are fixed relative to the anode and the cathode, but the conductive parts in the line plating regions and the deplating regions rotate with the line plating rollers. The line plating regions and the deplating regions are preferably disposed oppositely on bottoms and tops of the line plating rollers. For such an implementation, predictably, the conductive parts in the line plating regions will enter the deplating regions after rotating for 180 degrees, and will return to the line plating regions after further rotating for 180 degrees.

The present disclosure has the action principle that the conductive parts will be in contact with the surface of the semiconductor device in the cathode region when rotating to the line plating regions; under the condition that the power source is connected, a metal plating layer will be electroplated on a position, which has been in contact with the conductive parts, on the surface of the semiconductor device; and if the semiconductor device moves in a direction indicated by a linear arrow in FIG. 2, metal grid lines in the movement direction will be formed on the surface of the semiconductor device. At the same time, an inevitable problem existing in the prior art is that surfaces of the conductive parts (corresponding to a cathode of an electroplating device in the prior art) will be also plated with metal plating layers, at the moment, the conductive parts rotate to enter the deplating regions, and the metal plating layers on the surfaces of the conductive parts are consumed due to the lowering of potentials. With metallic copper as an example, an anodic half-reaction formula of copper plating layers on the conductive parts in the deplating regions is $Cu+2e^- \rightarrow Cu^{2+}$, so that self-consumption, i.e., deplating, of plated metals on the line plating rollers is realized, and the problem in the prior art that the plated metals are residual on an electroplating device to form residual metals is solved. The deplated conductive parts will enter the line plating regions again to electroplate the semiconductor device. At the moment, the surfaces of the conductive parts can be kept clean, and therefore, by such a circulation, the uniformity of the metal plating layer on the semiconductor device can be effectively improved.

Preferably, the conductive parts further include corrosion inhibition regions disposed between the line plating regions and the deplating regions; and potentials of the conductive parts in the deplating regions are V1, potentials of the conductive parts in the line plating regions are V2, potentials of the conductive parts in the corrosion inhibition regions are V3, V3/(V1−V2)=0 to 2, and V1−V2=2.1 V to 2.3 V. In the present disclosure, the potentials in the corrosion inhibition regions are far lower than the potential of potentials of the cathode and the anode, so that the conductive parts in the corrosion inhibition regions cannot be greatly electroplated or deplated. Therefore, when the conductive parts in the line plating regions rotate to the corrosion inhibition regions, metal residues on the surfaces thereof can be slowly etched under the corrosion action of the plating solution which is preferably an acidic solution and has a reaction formula: $2H^++Cu \rightarrow Cu^{2+}+H_2$. Therefore, the corrosion inhibition regions in the present disclosure have the effects that a certain distance is provided between each of the line plating regions and each of the deplating regions, almost all of the metals deposited in the line plating regions can be eliminated when passing through the corrosion inhibition regions and the deplating regions, it is ensured that electroplating and deplating on the line plating rollers are stably performed in order, and the amount of the metal residues on the surfaces of the conductive parts is reduced; and further, since the cleanliness of the surfaces of the conductive parts is improved, the uniformity of the plating layer on the semiconductor device can be effectively improved.

Preferably, V3/(V1−V2) is more preferably 0 to 0.2, and is most preferably 0, that is, V3=0.

Preferably, a ratio of the number of the conductive parts in the corrosion inhibition regions to the total number of the conductive part on each of the line plating rollers is 1/3 to 2/3.

Preferably, the line plating rollers and the anode are disposed on each of upper and lower sides of the cathode region to simultaneously plate double sides of the semiconductor device.

Preferably, driving rollers are disposed on a lower side of the cathode region, or driving rollers are disposed on upper and lower sides of the cathode region; and the driving rollers support and drive the semiconductor device to horizontally move in the cathode region, linear speeds v1 of the driving rollers are 0.2 m/min to 4 m/min, and linear speeds v2 of the line plating rollers are 0.2 m/min to 4 m/min.

Preferably, v1≥v2.

Preferably, a current density for line plating is 1 ASD to 20 ASD.

Preferably, specific electroplating steps are described as:

(1) firstly, adding a silicon wafer 410 from a feeding region of a manufacturing apparatus;

(2) pouring a blended plating solution into the apparatus, wherein the plating solution includes 50 g/L to 200 g/L of copper sulfate, 50 g/L to 300 g/L of sulfuric acid, and 10 ppm to 150 ppm of chloride ions;

(3) starting a circulation pipeline 100, stirring the plating solution, at the same time, ensuring that metal ions in the plating solution have sufficient activity, and a circulation speed is 200 L/min to 500 L/min;

(4) starting the line plating rollers 200 and the driving rollers 300 simultaneously or successively, driving, by a driving motor, the line plating rollers 200 to rotate at a rotating speed of 0.2 m/min to 4 m/min, and rotating at a rotating speed of 0.2 m/min to 4 m/min, by the driving rollers 300, to drive the silicon wafer 410 to horizontally move;

(5) finally, connecting the positive electrode of the power source to the deplating regions 201 of the line plating rollers 200, connecting the negative electrode of the power source to the line plating regions 202 of the line plating rollers 200, and starting electroplating at a power voltage of 1 V to 10 V; and (6) completing the electroplating, performing cleaning and drying, and receiving materials from a discharging region.

A manufacturing apparatus in the present disclosure adopts the manufacturing method for the electronic component in the present disclosure, and includes a plating solution region, a first driving member and a second driving member; line plating rollers are disposed in the plating solution region, and the first driving member is connected to the line plating rollers and is used for driving the line plating rollers to rotate; conductive parts are disposed in a circumferential direction of an outer side of each of the line plating rollers, and the conductive parts include line plating regions and deplating regions; an anode is disposed on outer sides of the deplating regions and is electrically connected to a positive electrode of a power source by the conductive parts in the deplating regions; a cathode region capable of holding a semiconductor device is disposed on outer sides of line plating regions, and the semiconductor device is electrically connected to a negative electrode of the power source by the conductive parts in the line plating regions; the second driving member is connected to the semiconductor device, and is used for driving the semiconductor device to move in the cathode region.

Preferably, a plurality of conductive parts are sequentially disposed in the circumferential direction of the outer side of each of the line plating rollers, M1 conductive parts are disposed in each of the deplating regions, M2 conductive parts are disposed in each of the line plating regions, and M1≥M2. The number of the conductive parts in the deplating regions is not smaller than the number of the conductive parts in the line plating regions, which ensures that the amount of consumable residual metals in the deplating regions is not smaller than a deposition thereof in the line plating regions, and then ensures that almost no metal residues are retained on the line plating rollers.

Preferably, a total number M of the conductive parts on each of the line plating rollers is 10 to 100, and M2/M=(0.2 to 0.5):1.

Preferably, a plurality of line plating rollers are included, and are respectively disposed on two sides of the cathode region. Due to the design of the line plating rollers in the present disclosure, it is possible to dispose the line plating rollers on two sides of the cathode region, simultaneous double-sided electroplating of the semiconductor device is realized, the problem in the prior art that it is difficult to realize double-sided electroplating by adopting a horizontal electroplating process is solved, and the production efficiency is effectively increased.

Preferably, a plurality of line plating rollers are included, and are disposed on one side of the cathode region. Due to the design of the line plating rollers in the present disclosure, the line plating rollers can be only disposed on one side of the cathode region according to an actual demand.

Preferably, the conductive parts include conductive brushes, the conductive brushes are made of conductive fibers of which diameters are 0.2 μm to 5 μm, and diameters of the conductive brushes are 5 μm to 30 μm.

Preferably, diameters of the line plating rollers are 8 mm to 100 mm, and lengths of the conductive parts in radial directions of the line plating rollers are 0.2 mm to 5 mm.

Preferably, a plurality of electric contact points are disposed in ends of the line plating rollers, the electric contact points are disposed along edges of the line plating rollers, and the electric contact points are all disposed to correspond and be electrically connected to the conductive parts one to one; and electric contact points corresponding to the deplating regions are connected to a positive electrode end of the power source, and electric contact points corresponding to the line plating regions are connected to a negative electrode region of the power source. The electric contact points preferably adopt conductive carbon brushes.

The first driving member and the second driving member may be disposed separately or integrally. When the both are disposed integrally, the semiconductor device can be only driven by the line plating rollers to move in the cathode region. Preferably, the first driving member includes a driving motor of which an output shaft is disposed to be concentric and connected to the line plating rollers; and the second driving member includes driving rollers which are disposed on a side of the cathode region and are connected to the semiconductor device in a rolling way.

Preferably, a circulation pipeline used for stirring a plating solution in the plating solution region is further disposed in the plating solution region.

Preferably, the anode includes a metal plate, the semiconductor device includes a silicon wafer or battery slice, and the silicon wafer or battery slice is disposed to be parallel or horizontal relative to the metal plate.

3. Beneficial Effects

Compared with the prior art, the present disclosure has the beneficial effects:
(1) according to the manufacturing method for the electronic component in the present disclosure, the surface of the semiconductor device is plated with the metal layer by means of rotation of the line plating rollers, the line plating rollers simultaneously have electroplating and deplating functions, and if the line plating rollers rotate for a circle, plated metals on the surfaces of the line plating rollers can be effectively consumed, so that self-consumption of the residual metals on the manufacturing apparatus is realized, the surface finish of the conductive parts is ensured, then, the electroplating efficiency of the conductive parts for the surface of the semiconductor device is increased, the uniformity of the metal layer plated on the surface of the semiconductor device such as the silicon wafer or battery slice is improved, and it is ensured that the uniformity is less than or equal to 5%.

(2) according to the manufacturing method for the electronic component in the present disclosure, double sides or any side of the semiconductor device can be selectively electroplated, and particularly, double sides of the semiconductor device can be simultaneously electroplated, so that the demand on double-sided electroplating in actual production is satisfied, and the production efficiency is increased.

(3) according to the manufacturing method for the electronic component in the present disclosure, the corrosion inhibition regions are disposed between the line plating regions and the deplating regions, so that the problem of incomplete or untimely deplating and low electroplating efficiency caused by rapidly switching the conductive parts between the line plating regions and the deplating regions can be effectively reduced, and then, the uniformity of the metal layer plated on the surface of the semiconductor device is effectively improved.

Figure 1:
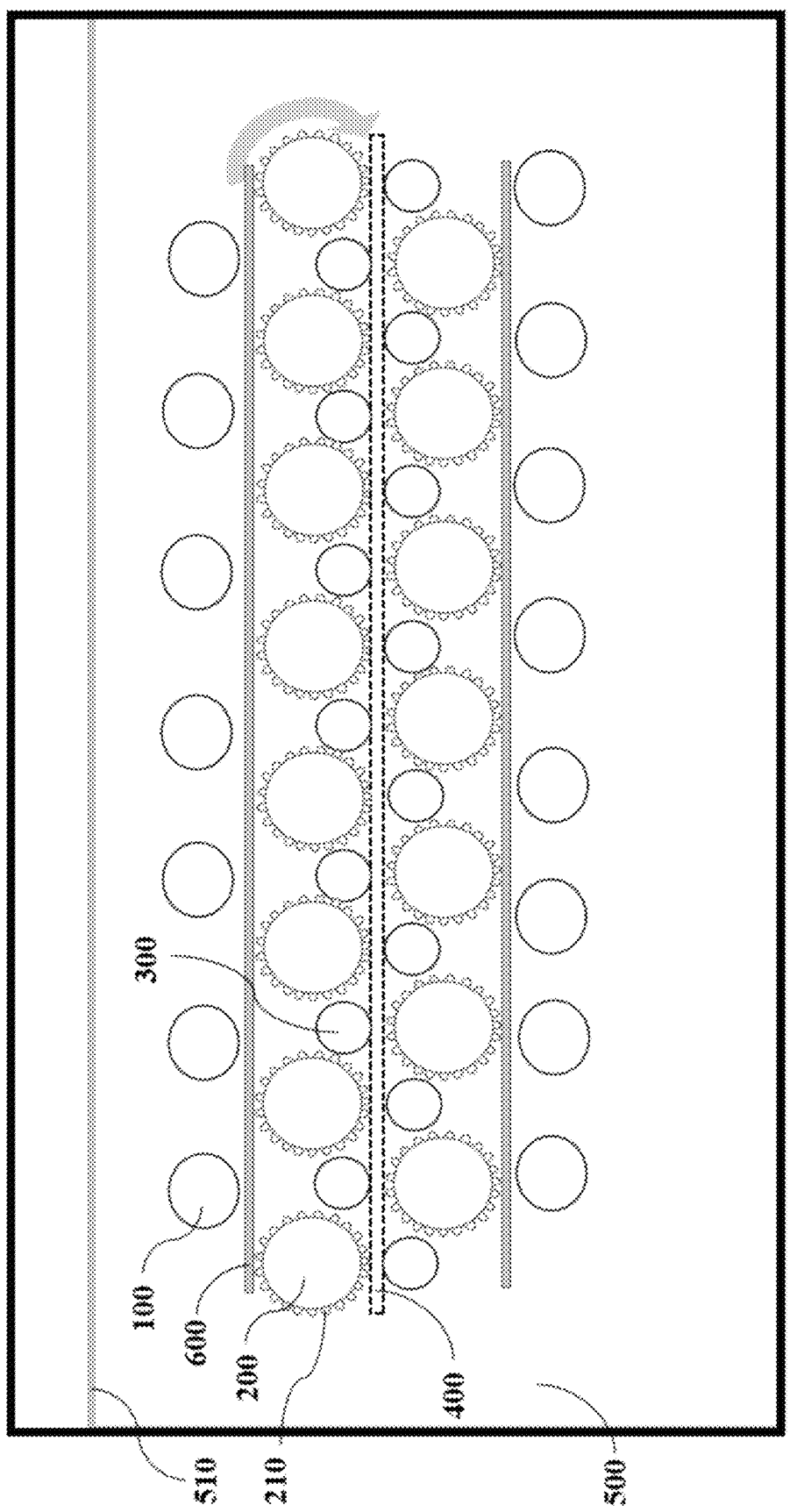
FIG. 1 is a schematic view of a manufacturing apparatus in the present disclosure.

In which:
100, circulation pipeline;
200, line plating roller; 201, deplating region; 202, line plating region; 203, corrosion inhibition region; 210, conductive part; 220, electric contact point; 221, spring; 222, conductive rod; 230, driving motor; 231, output shaft;
300, driving roller;
400, cathode region; 410, silicon wafer;
500, plating solution region; 510, plating solution surface;
600, anode;
710, positive electrode end; 720, insulating region; and 730, negative electrode end.

DETAILED DESCRIPTION OF THE EMBODIMENTS

Following Detailed descriptions for exemplary embodiments of the present disclosure will refer to the accompanying drawings which form a part of the descriptions, and examples in the accompanying drawings show executable exemplary embodiments of the present disclosure, wherein features of the present disclosure are marked with reference numerals in the accompanying drawings. Following more detailed descriptions for the embodiments of the present disclosure are only intended to illustrate, rather than to limit the claimed scope of the present disclosure or limit the descriptions for the characteristics and features of the present disclosure, so that the optimal way of implementing the present disclosure is put forward, and it is sufficiently ensured that the present disclosure can be implemented by the skilled in the art. However, it should be understood that various modifications and variations can be made without departing from the scope of the present disclosure limited according to the appended claims. The detailed descriptions and accompanying drawings should be only considered to be illustrative, rather than restrictive. If there are any such modifications and variations, they will all fall within the scope of the present disclosure described herein. In addition, the background art is intended to describe the search and development status and significance of the present technology, rather than to limit the present disclosure or the present application and application fields of the present disclosure.

Unless defined otherwise, all technical and scientific terms used herein have the same meaning as commonly understood by those skilled in the art to which the present disclosure belongs; and the terms used in the description of the present disclosure described herein are only intended to describe specific embodiments, rather than to limit the present disclosure.

It should be noted that when one component is referred to as "disposed" on the other component, it may be directly located on the other component or there may also be a centered component; when one component is considered to be "connected" to the other component, it may be directly connected to the other component or there may be a centered component at the same time; and terms "first", "second", "upper", "lower" and similar expressions used herein are only for the purpose of illustration.

The present embodiment provides a manufacturing apparatus used for plating metal lines on a surface of a semiconductor device which is preferably a silicon wafer 410 or battery slice in the present disclosure, and the silicon wafer 410 or battery slice serves as a cathode in the manufacturing apparatus.

Figure 2:
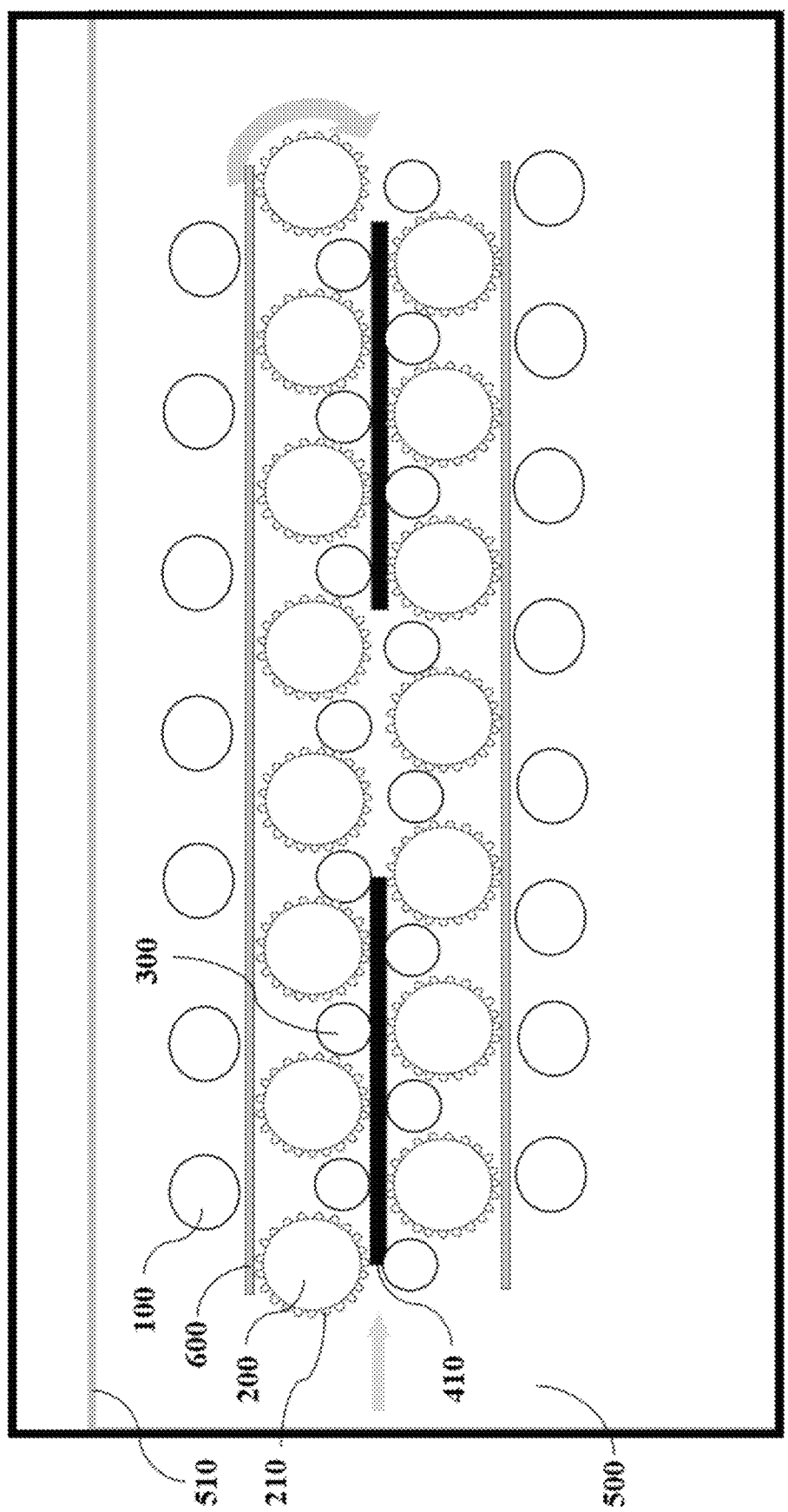
FIG. 2 is a schematic view of plating lines on a silicon wafer by using the manufacturing apparatus in the present disclosure.

Specifically, with reference to FIG. 1 and FIG. 2, a plating solution region 500 for holding a plating solution is disposed in the manufacturing apparatus, and an anode 600, line plating rollers 200 and the silicon wafer 410 serving as the cathode are disposed in the plating solution region 500. The anode 600 preferably adopts a metal plate made of the same material as a plated metal, and the anode 600 is disposed on one side of each of the line plating rollers 200, and is in electric contact with the line plating rollers 200. The silicon wafer 410 is disposed in a cathode region 400 on the other sides, opposite to the anode metal plate, of the line plating rollers 200, and is disposed to be parallel and horizontal relative to the anode metal plate. Therefore, the line plating rollers 200 are tangent and are disposed between the silicon wafer 410 and the anode metal plate, and preferably, a plurality of line plating rollers 200 are disposed, so that the electroplating efficiency is increased. It should be noted that the purpose of disposing the silicon wafer 410 to be parallel and horizontal is to horizontally electroplate the silicon wafer 410, thereby satisfying the production demand of the battery slice; and in other embodiments, the silicon wafer 410 and the anode metal plate may be disposed to form any angle, or disposed to be non-horizontal without affecting the achievement of functions of the manufacturing apparatus in the present disclosure.

Figure 3:
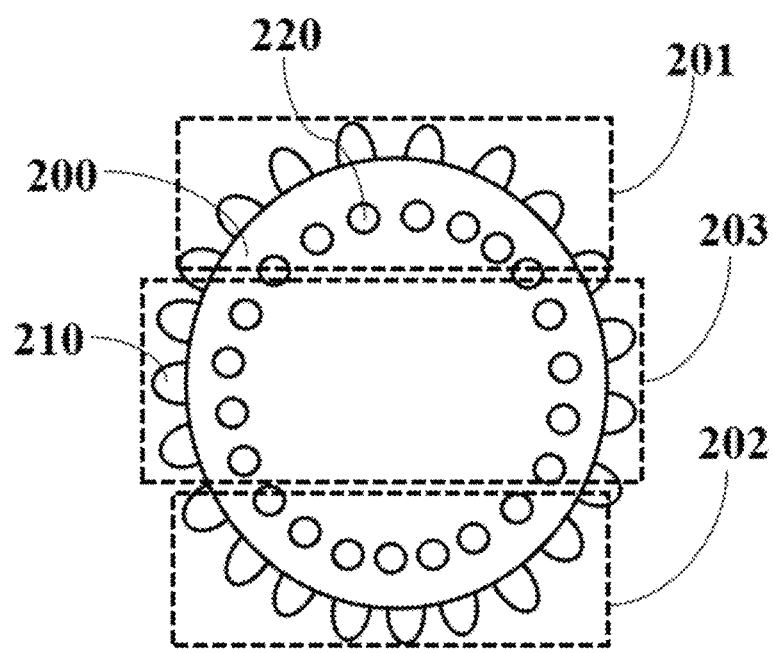
FIG. 3 is a schematic view of a line plating roller in the present disclosure.

More specifically, with reference to FIG. 1 to FIG. 3, in the present embodiment, a plurality of conductive parts 210 are disposed in circumferential directions of outer sides of the line plating rollers 200, and electroplating and deplating are achieved by means of continuous contact between the rotating conductive parts 210 and each of the silicon wafer 410 and the anode metal plate. In some embodiments, the conductive parts 210 are preferably conductive brushes, and the conductive brushes are made of conductive fibers of which diameters are 0.2 μm to 5 μm; diameters of the conductive fibers selected in the present embodiment are 2 μm; diameters of the conductive brushes are 5 μm to 30 μm, and diameters of the conductive brushes selected in the present embodiment are 15 μm; and lengths of the conductive brushes in radial directions of the line plating rollers 200 are 0.2 mm to 5 mm, and lengths selected in the present embodiment are 3 mm. In addition, the line plating rollers 200 are preferably set to have diameters of 8 mm to 100 mm and lengths of 160 mm to 4000 mm, and the line plating rollers 200 in the present embodiment have diameters of 30 mm and lengths of 1800 mm. In other embodiments, the conductive parts 210 may also select any conductive electronic components, preferably flexible electronic components, to avoid damaging the silicon wafer 410.

As shown in FIG. 3, the conductive parts 210 include line plating regions 202 and deplating regions 201, wherein the conductive parts 210 in the deplating region 201 are in electric contact with the anode metal plate, and the conductive parts 210 in the line plating regions 202 are in electric contact with the silicon wafer 410. The anode metal plate is electrically connected to a positive electrode of a power source by the conductive parts 210 in the deplating regions 201, and the silicon wafer 410 is electrically connected to a negative electrode of the power source by the conductive parts 210 in the line plating regions 202. Specifically, with reference to FIG. 4 and FIG. 5, the power source is provided with a positive electrode end 710 and a negative electrode end 730 for outward output; a plurality of electric contact points 220 are disposed in ends of the line plating rollers 200, the electric contact points 220 are disposed along edges of the line plating rollers 200, the electric contact points 220 are all disposed to correspond and be electrically connected to the conductive parts 210 one to one by conductive rods 222, and the electric contact points 220 lean against the positive electrode end 710 and the negative electrode end 730 of the power source. Therefore, the electric contact points 220 connected to the positive electrode end 710 of the power source transmit positive charges to the conductive parts 210 in the deplating regions 201 connected to the electric contact points 220, thereby deplating residual metals on the conductive parts 210 in the deplating regions 201; the electric contact points 220 connected to the negative electrode end 730 of the power source transmit negative charges to the conductive parts 210 in the line plating regions 202 connected to the electric contact points 220, at the moment, the surface of the silicon wafer 410 in contact with the conductive parts 210 in the line plating regions 202 can be plated with metals, and with the movement of the silicon wafer 410 in the cathode region 400, the plated metals form metal grid lines in the movement direction. Further, in order to increase the contact between each of the electric contact points 220 and each of the positive electrode end 710 and the negative electrode end 730 of the power source, a spring 221 may be mounted between each of the electric contact points 220 and each of the conductive rods 222, thereby increasing pressing forces from the electric contact points 220 to the positive electrode end 710 and the negative electrode end 730 of the power source.

In order to satisfy the demand for horizontally electroplating the silicon wafer 410, in some embodiments, a first driving member drives the line plating rollers 200 to rotate, linear speeds v2 of the line plating rollers 200 are 0.2 m/min to 4 m/min, and in the present embodiment, the linear speeds v2 are 1 m/min; and a second driving member drives the silicon wafer 410 to move in the cathode region 400, linear speeds v1 of driving rollers 300 are 0.2 m/min to 4 m/min, and in the present embodiment, the linear speeds v1 are 1 m/min. In order to avoid friction between the silicon wafer 410 and each of the line plating rollers 200, linear speeds of the both are preferably set to be the same.

As a specific implementation, the first driving member may select a driving motor 230 of which an output shaft 231 is disposed to be concentric and connected to the line plating rollers 200; and the second driving member may select the driving rollers 300 with driving motors, as shown in FIG. 1 and FIG. 2, the driving rollers 300 are disposed on a side of the cathode region 400 and are connected to the silicon wafer 410 in a rolling way, thereby driving the silicon wafer 410 to horizontally move, and also playing a role in supporting the silicon wafer 410. In the present embodiment, the line plating rollers 200 and the driving rollers 300 are both disposed on two sides of the cathode region 400, thereby realizing double-sided electroplating of the silicon wafer 410; and in other embodiments, the line plating rollers 200 and the driving rollers 300 may also be disposed on a bottom side of the cathode region 400, thereby realizing single-sided electroplating of the silicon wafer 410. Specific selection may be based on an electroplating demand.

In other embodiments, the above-mentioned first driving member and second driving member may be further disposed integrally. For such an implementation, the silicon wafer 410 needs to be driven by the conductive parts 210 on the line plating rollers 200 to move, and in order to provide a sufficient driving force, the conductive parts 210 preferably use hard conductive parts except that such an implementation may damage the surface of the silicon wafer 410, but cannot affect the achievement of functions of the manufacturing apparatus in the present disclosure.

Figure 4:
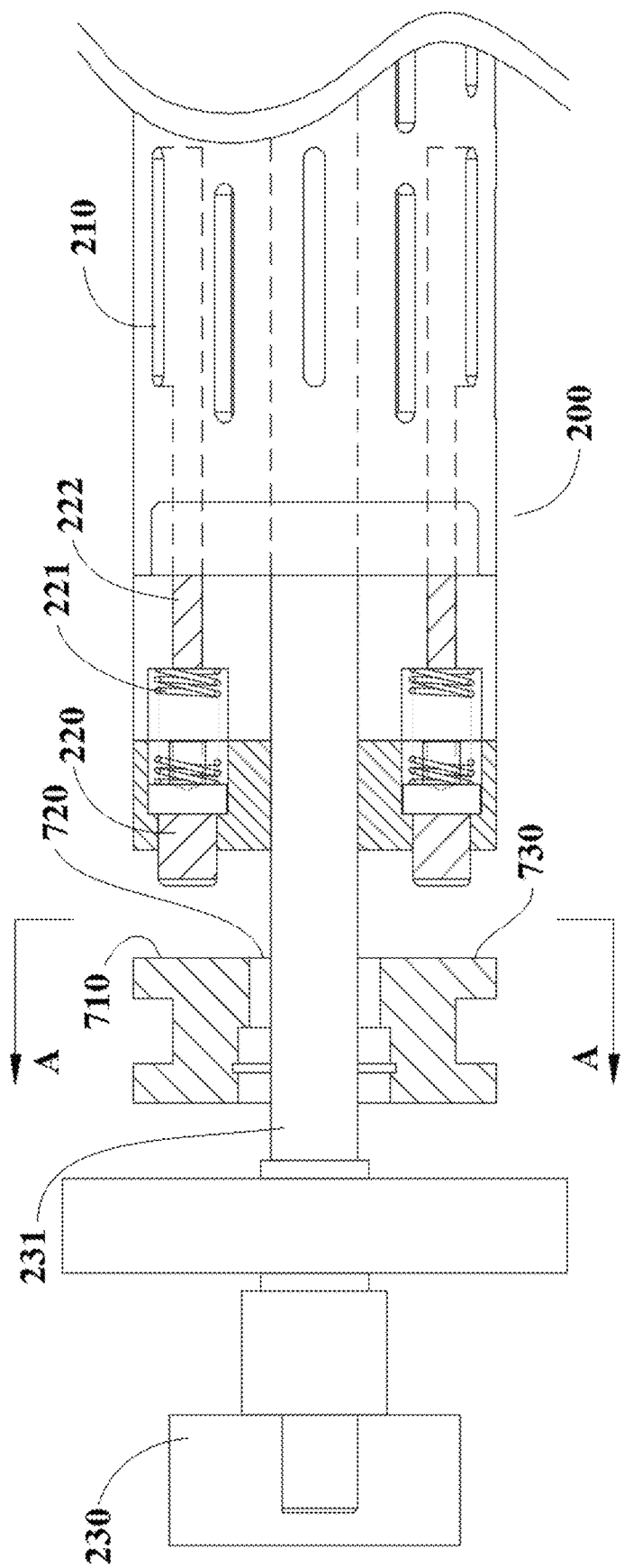
FIG. 4 is a schematic view of connection between a line plating roller and a power source in the present disclosure.
Figure 5:
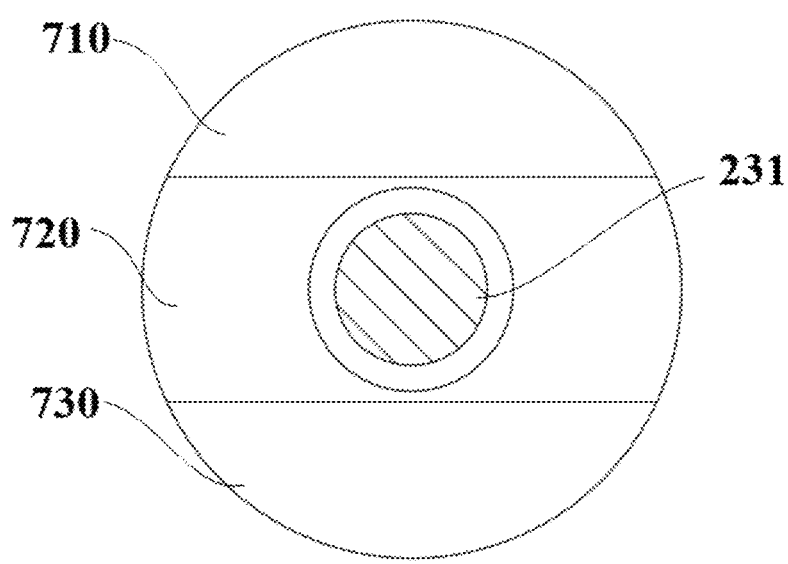
FIG. 5 is a sectional view of part A-A in FIG. 4.

Further, in some embodiment (as such embodiments 1 to 8), with reference to FIG. 3, preferably, corrosion inhibition regions 203 are disposed between the line plating regions 202 and the deplating regions 201, and potentials of the corrosion inhibition regions 203 are 0, that is, the corrosion inhibition regions 203 are not connected to the positive or negative electrode of the power source. With reference to FIG. 4 and FIG. 5, the corrosion inhibition regions 203 correspond to an insulating region 720 on an output end of the power source, and the insulating region 720 is located between the positive electrode end 710 and the negative electrode end 730 to space the positive electrode end 710 and the negative electrode end 730, so that the conductive brushes correspond to the insulating region 720 and are not connected to the positive electrode end 710 or the negative electrode end 730 when rotating to the corrosion inhibition regions 203, and then, the purpose of corrosion inhibition is achieved. M conductive brushes are uniformly and sequentially disposed in the circumferential direction of the outer side of each of the line plating rollers 200, wherein M1 conductive parts 210 are disposed in the deplating region 201, M2 conductive parts 210 are disposed in each of the line plating regions 202, M3 conductive parts 210 are disposed in each of the corrosion inhibition regions 203, preferably, M1≥M2, M2/M=(0.2 to 0.5):1, and M3/M=1/3 to 2/3. Predictably, for the implementation in which there are the corrosion inhibition regions 203, the corrosion inhibition regions 203 can also play a deplating role except that the deplating principle is different from that of the deplating regions 201, and the deplating speed is relatively slow, therefore, M1 may also be smaller than M2; and for a situation that there are no corrosion inhibition regions 203, the deplating of the metals on the line plating rollers 200 can only depend on the deplating regions 201, and therefore, it is best that M≥M2, which can ensure that no net growth of the metals on the line plating rollers 200 occurs.

It should be noted that only one preferred implementation is provided for the above-mentioned corrosion inhibition regions 203 of which the potentials are 0, which is for the purpose of reducing the deposition of the plated metals on the conductive brushes as much as possible. In other embodiments, potentials of the conductive parts 210 in the deplating regions 201 are V1, potentials of the conductive parts 210 in the line plating regions 202 are V2, potentials of the conductive parts 210 in the corrosion inhibition regions 203 are V3, for a power voltage V1−V2=2.1 V to 2.3 V, V3/(V1−V2) is preferably set as 0 to 2, and is more preferably 0 to 0.2, and the corrosion inhibition regions 203 in the range can still play an effective corrosion inhibition role.

In the present embodiment, a circulation pipeline 100, as shown in FIG. 1 and FIG. 2, used for stirring the plating solution in the plating solution region 500 is further disposed in the plating solution region 500, so that the plating solution near the silicon wafer 410 is more uniform, and then, the plated metals on the surface of the silicon wafer 410 are more uniform.

The present disclosure will be further described below in conjunction with specific embodiments.

Embodiment 1

The present embodiment provides a manufacturing method for an electronic component, in which a used manufacturing apparatus has a specific structure described as above, wherein the line plating rollers 200 include the deplating regions 201, the line plating regions 202, and the corrosion inhibition regions 203; and in the present embodiment, M1=10, M2=15, and M3=15. The semiconductor device used in the present embodiment is a P-type silicon wafer 410, and a surface of the P-type silicon wafer 410 is plated with copper grid lines. Specific steps are described as follows:

(1) firstly, the silicon wafer 410 is put from a feeding region on one side of the cathode region 400 of the manufacturing apparatus;

(2) a blended plating solution is poured into the plating solution region 500 of the apparatus, and the circulation pipeline 100, the line plating rollers 200, the driving rollers 300, the cathode region 400 and the anode 600 are all immersed under a plating solution surface 510; wherein the plating solution includes 120 g/L of copper sulfate, 150 g/L of sulfuric acid, and 60 ppm of chloride ions;

(3) the circulation pipeline 100 are started, the plating solution is stirred, at the same time, it is ensured that metal ions in the plating solution have sufficient activity, and a circulation speed is 350 L/min;

(4) the line plating rollers 200 and the driving rollers 300 are started successively, the driving motor drives the line plating rollers 200 to rotate at a rotating speed of 1 m/min, and the driving motor drives the driving rollers 300 to rotate at a rotating speed of 1 m/min to drive the silicon wafer 410 to horizontally move;

(5) finally, the positive electrode of the power source is connected to the deplating regions 201 of the line plating rollers 200, the negative electrode of the power source is connected to the line plating regions 202 of the line plating rollers 200, and electroplating is started at a power voltage of 2.19 V and a current density of 1 ASD; and (6) the electroplating is completed, cleaning and drying are performed, and materials are received from a discharging region on the other side of the cathode region 400.

A square resistance test is performed on the electroplated surface of the silicon wafer, 25 points are uniformly selected, and a variance of a test result is calculated to obtain a uniformity number recorded in table 1.

TABLE 1

Line Plating Uniformity of Surface of Silicon Wafer in Different Implementations

| Implementation | Doping type of silicon wafer | Whether there are corrosion inhibition regions | Current density | Uniformity |
|---|---|---|---|---|
| Embodiment 1 | P type | Yes | 1 ASD | 2.1% |
| Embodiment 2 | | | 5 ASD | 2.5% |
| Embodiment 3 | | | 10 ASD | 2.8% |
| Embodiment 4 | | | 12 ASD | 3.0% |
| Embodiment 5 | | | 15 ASD | 3.2% |
| Embodiment 6 | | | 18 ASD | 4% |
| Embodiment 7 | | | 20 ASD | 5.0% |
| Embodiment 8 | N type | | | 4.2% |
| Embodiment 9 | P type | No | | 15.2% |
| Embodiment 10 | N type | | | 12.3% |
| Comparative example 1 | N type | / | 15 ASD | 20% |
| Comparative example 2 | N type | | 8 ASD | 15% |

Embodiment 2

The present embodiment provides a manufacturing method for an electronic component, in which a used manufacturing apparatus has a specific structure basically the same as that in embodiment 1. In addition, the semiconductor device used in the present embodiment is a P-type silicon wafer 410, a surface of the P-type silicon wafer 410 is plated with copper grid lines, specific steps thereof are basically the same as those in embodiment 1, and a main difference is that the current density is 5 ASD.

A uniformity test is performed on the electroplated surface of the silicon wafer, and a test result is recorded in table 1.

Embodiment 3

The present embodiment provides a manufacturing method for an electronic component, in which a used manufacturing apparatus has a specific structure basically the same as that in embodiment 1. In addition, the semiconductor device used in the present embodiment is a P-type silicon wafer 410, a surface of the P-type silicon wafer 410 is plated with copper grid lines, specific steps thereof are basically the same as those in embodiment 1, and a main difference is that the current density is 10 ASD.

A uniformity test is performed on the electroplated surface of the silicon wafer, and a test result is recorded in table 1.

Embodiment 4

The present embodiment provides a manufacturing method for an electronic component, in which a used manufacturing apparatus has a specific structure basically the same as that in embodiment 1. In addition, the semiconductor device used in the present embodiment is a P-type silicon wafer 410, a surface of the P-type silicon wafer 410 is plated with copper grid lines, specific steps thereof are basically the same as those in embodiment 1, and a main difference is that the current density is 12 ASD.

A uniformity test is performed on the electroplated surface of the silicon wafer, and a test result is recorded in table 1.

Embodiment 5

The present embodiment provides a manufacturing method for an electronic component, in which a used manufacturing apparatus has a specific structure basically the same as that in embodiment 1. In addition, the semiconductor device used in the present embodiment is a P-type silicon wafer 410, a surface of the P-type silicon wafer 410 is plated with copper grid lines, specific steps thereof are basically the same as those in embodiment 1, and a main difference is that the current density is 15 ASD.

A uniformity test is performed on the electroplated surface of the silicon wafer, and a test result is recorded in table 1.

Embodiment 6

The present embodiment provides a manufacturing method for an electronic component, in which a used manufacturing apparatus has a specific structure basically the same as that in embodiment 1. In addition, the semiconductor device used in the present embodiment is a P-type silicon wafer 410, a surface of the P-type silicon wafer 410 is plated with copper grid lines, specific steps thereof are basically the same as those in embodiment 1, and a main difference is that the current density is 18 ASD.

A uniformity test is performed on the electroplated surface of the silicon wafer, and a test result is recorded in table 1.

Embodiment 7

The present embodiment provides a manufacturing method for an electronic component, in which a used manufacturing apparatus has a specific structure basically the same as that in embodiment 1. In addition, the semiconductor device used in the present embodiment is a P-type silicon wafer 410, a surface of the P-type silicon wafer 410 is plated with copper grid lines, specific steps thereof are basically the same as those in embodiment 1, and a main difference is that the current density is 20 ASD.

A uniformity test is performed on the electroplated surface of the silicon wafer, and a test result is recorded in table 1.

Embodiment 8

The present embodiment provides a manufacturing method for an electronic component, in which a used manufacturing apparatus has a specific structure basically the same as that in embodiment 7. In addition, the semiconductor device used in the present embodiment is a P-type silicon wafer 410, a surface of the P-type silicon wafer 410 is plated with copper grid lines, specific steps thereof are basically the same as those in embodiment 7, and a main difference is that the electroplated surface is converted from a P type to an N type.

A uniformity test is performed on the electroplated surface of the silicon wafer, and a test result is recorded in table 1.

Embodiment 9

The present embodiment provides a manufacturing method for an electronic component, in which a used manufacturing apparatus has a specific structure basically the same as that in embodiment 7. In addition, the semiconductor device used in the present embodiment is a P-type silicon wafer 410, a surface of the P-type silicon wafer 410 is plated with copper grid lines, specific steps thereof are basically the same as those in embodiment 7, and a main difference is that the corrosion inhibition regions 203 are removed.

Specific specifications of the line plating rollers 200 in the present embodiment are that: diameters are 30 mm, lengths are 1800 mm, M1=15, and M2=10.

A uniformity test is performed on the electroplated surface of the silicon wafer, and a test result is recorded in table 1.

Embodiment 10

The present embodiment provides a manufacturing method for an electronic component, in which a used manufacturing apparatus has a specific structure basically the same as that in embodiment 9. In addition, the semiconductor device used in the present embodiment is a P-type silicon wafer 410, a surface of the P-type silicon wafer 410 is plated with copper grid lines, specific steps thereof are basically the same as those in embodiment 9, and a main difference is that the electroplated surface is converted from a P type to an N type.

A uniformity test is performed on the electroplated surface of the silicon wafer, and a test result is recorded in table 1.

Comparative Example 1

The present comparative example provides a rack plating method including the specific steps:
(1) a photovoltaic battery slice is clamped on a rack, and an N/P surface is combined with the rack, wherein a size of a combination point is 0.8 mm*0.8 mm;
(2) the rack is delivered to a plating solution through a guide rail, and electroplating is performed by means of a power source with an independent N/P surface, wherein a voltage is 3 V, and a current density is 12 ABS;
(3) circulation is started, wherein a circulation volume is 200 L/min, and a movement speed is 0.3 m/min; and
(4) the electroplating is completed, cleaning and drying are performed, and materials are received from a discharging region.

A uniformity test is performed on the electroplated surface of the silicon wafer, and a test result is recorded in table 1. The result is that the uniformity is poorer due to the influence of a baffle on the bottom of the rack and racking points.

Comparative Example 2

The present comparative example provides a horizontal electroplating method including the specific steps:

(1) an electrode of a horizontal electroplating device existing on the market is used, wherein the electrode is of a flat belt type, and widths of contact points are greater than 80 μm;
(2) electroplating is performed by combining a conductive band and a battery slice, wherein a voltage is 2.89 V, and a current density is 8 ASD;
(3) circulation is started, wherein a circulation volume is 80 L/min, and a movement speed is 0.2 m/min; and
(4) the electroplating is completed, cleaning and drying are performed, and materials are received from a discharging region.

A uniformity test is performed on the electroplated surface of the silicon wafer, and a test result is recorded in table 1. The result is that the contact points cannot be self-unracked to result in poor contact during electroplating, and therefore, the uniformity is poorer.

In the present disclosure, the manufacturing apparatuses in embodiments 1 to 8 are further compared with a traditional line plating device, as shown in table 2:

TABLE 2

Comparison Between Manufacturing Apparatus in the Present Invention and Traditional Line Plating Device

| | Occupancy/ $m^2$ | Productivity/ % | Operation and maintenance cost ten thousand/ year | Production capacity pcs/h |
|---|---|---|---|---|
| Rack plating device in comparative example 1 | 340 | 90 | 30 | 3000 |
| Horizontal plating device in comparative example 2 | 200 | 70 | 15 | 5000 |
| Manufacturing device in the present disclosure | 100 | 50 | 2 | 8000 |

It can be known from table 2 that the manufacturing apparatus in the present disclosure can also effectively reduce the production cost and increase the production capacity.

In conclusion, the present disclosure main designs a line plating apparatus with line plating rollers playing a main role. By controlling electrifying situations of the conductive brushes during the rotation of the line plating rollers, any side or double sides of a target photovoltaic cell panel can be plated, and the line plating rollers can eliminate copper deposited on electrodes of the conductive brushes during long-time line plating, so that not only is the line plating uniformity ensured, but also the production efficiency is increased, and the running stability of the device is improved.

The present disclosure has been described in detail hereinbefore in conjunction with the specific exemplary embodiments. However, it should be understood that various modifications and variations are made without departing from the scope of the present disclosure limited by the appended claims. The detailed descriptions and accompanying drawings should be only considered to be illustrative, rather than restrictive. If there are any such modifications and variations, they will all fall within the scope of the present disclosure described herein. In addition, the background art is intended to describe the search and development status and significance of the present technology, rather than to limit the present disclosure or the present application and application fields of the present disclosure.

More specifically, although the exemplary embodiments of the present disclosure have been described herein, the present disclosure is not limited to these embodiments, but includes any or all amended and omitted embodiments, such as combinations of all the embodiments and adaptive changes and/or substitutions, that can be cognized by the skilled in the art according to the foregoing detailed descriptions. Limitations in the claims can be widely explained according to languages used in the claims, but are not limited to the examples described in the foregoing detailed descriptions or described when the present application is implemented, and these examples should be considered to be exclusive. Any steps enumerated in claims of any methods or processes can be performed in any orders not limited to the order put forward in the claims. Therefore, the scope of the present disclosure should be only determined by the appended claims and legal equivalents thereof, rather than the descriptions and examples given hereinbefore.

Unless limited otherwise, all technical and scientific terms used herein have the same meaning as commonly understood by those of ordinary skill in the art to which the present disclosure belongs. When there are conflicts, the terms are subject to definitions in the present description. When a diameter, a length, a current density, a potential, a voltage, a speed or other values or parameters are denoted by a range, a preferred range, or a range limited by a series of upper limits of preferred values and lower limits of preferred values, it should be understood that all ranges formed by any pair of an upper limit of any range or preferred value and a lower limit of any range or preferred value are specifically disclosed no matter whether the range has been disclosed independently. For example, a range of 1 to 50 should be understood as any numbers from 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, and 50, combinations of the numbers, or a subrange, and decimal values, such as 1.1, 1.2, 1.3, 1.4, 1.5, 1.6, 1.7, 1.8, and 1.9, among the above-mentioned integers. For the subrange, "a nested subrange" extending from any end points within the range is specifically considered. For example, a nested subrange of an exemplary range 1 to 50 may include 1 to 10, 1 to 20, 1 to 30, and 1 to 40 in one direction, or 50 to 40, 50 to 30, 50 to 20, and 50 to 10 in the other direction.

What is claimed is:

1. A manufacturing method for an electronic component which is used for plating copper grid lines on a surface of a semiconductor device, wherein the manufacturing method comprises: putting a semiconductor device into a cathode region (400), and driving the semiconductor device to move in the cathode region (400), at the same time, connecting line plating rollers (200) to a power source, and driving the line plating rollers (200) to rotate, so that a surface of the semiconductor device is plated with copper grid lines in a movement direction thereof by conductive parts (210) located in a circumferential direction of an outer side of each of the line plating rollers (200); the conductive parts (210) comprise line plating regions (202) and deplating regions (201); an anode (600) is disposed on outer sides of the deplating regions (201) and is electrically connected to a positive electrode of the power source by the conductive parts (210) in the deplating regions (201); and the cathode region (400) capable of holding the semiconductor device is disposed on outer sides of the line plating regions (202), and the semiconductor device is electrically connected to a negative electrode of the power source by the conductive parts (210) in the line plating regions (202); and the conductive parts (210) further comprise corrosion inhibition regions (203) disposed between the line plating regions (202) and the deplating regions (201); and a plurality of conductive parts (210) are sequentially disposed in the circumferential direction of the outer side of each of the line plating rollers (200), M1 conductive parts (210) are disposed in each of the deplating regions (201), M2 conductive parts (210) are disposed in each of the line plating regions (202), and M1≥M2.

2. The manufacturing method for the electronic component according to claim 1, wherein a ratio of the number of the conductive parts (210) in the corrosion inhibition regions (203) to the total number of the conductive parts (210) on each of the line plating rollers (200) is 1/3 to 2/3.

3. The manufacturing method for the electronic component according to claim 1, wherein the line plating rollers (200) and the anode (600) are disposed on each of upper and lower sides of the cathode region (400) to simultaneously plate double sides of the semiconductor device.

4. The manufacturing method for the electronic component according to claim 1, wherein driving rollers (300) are disposed on a lower side of the cathode region (400), or driving rollers (300) are disposed on upper and lower sides of the cathode region (400); and the driving rollers (400) support and drive the semiconductor device to horizontally move in the cathode region (400), linear speeds v1 of the driving rollers (300) are 0.2 m/min to 4 m/min, and linear speeds v2 of the line plating rollers (200) are 0.2 m/min to 4 m/min.

5. The manufacturing method for the electronic component according to claim 4, wherein v1≥v2.

6. The manufacturing method for the electronic component according to claim 1, wherein a current density for line plating is 1 ASD to 20 ASD.

7. A manufacturing apparatus, which is used for plating copper grid lines on a surface of a semiconductor device based on the manufacturing method for the electronic component according to claim 1, wherein the manufacturing apparatus comprises a plating solution region (500), a first driving member and a second driving member;

line plating rollers (200) are disposed in the plating solution region (500), and the first driving member is connected to the line plating rollers (200) and is used for driving the line plating rollers (200) to rotate;

conductive parts (210) are disposed in a circumferential direction of an outer side of each of the line plating rollers (200), and the conductive parts (210) comprise line plating regions (202) and deplating regions (201); an anode (600) is disposed on outer sides of the deplating regions (201) and is electrically connected to a positive electrode of a power source by the conductive parts (210) in the deplating regions (201); a cathode region (400) capable of holding a semiconductor device is disposed on outer sides of line plating regions (202), and the semiconductor device is electrically connected to a negative electrode of the power source by the conductive parts (210) in the line plating regions (202);

a plurality of conductive parts (210) are sequentially disposed in the circumferential direction of the outer side of each of the line plating rollers (200), M1 conductive parts (210) are disposed in each of the deplating regions (201), M2 conductive parts (210) are disposed in each of the line plating regions (202), and M1≥M2; and the second driving member is connected to the semiconductor device, and is used for driving the semiconductor device to move in the cathode region (400).

8. The manufacturing apparatus according to claim 7, wherein a total number M of the conductive parts (210) on the line plating rollers (200) is 10 to 100, and M2/M=(0.2 to 0.5):1.

9. The manufacturing apparatus according to claim 7, wherein the line plating rollers (200) are respectively disposed on two sides of the cathode region (400); or the line plating rollers (200) are disposed on one side of the cathode region (400).

10. The manufacturing apparatus according to claim 7, wherein the conductive parts (210) comprise conductive brushes, the conductive brushes are made of conductive fibers of which diameters are 0.2 μm to 5 μm, and diameters of the conductive brushes are 5 μm to 30 μm.

11. The manufacturing apparatus according to claim 7, wherein diameters of the line plating rollers (200) are 8 mm to 100 mm, and lengths of the conductive parts (210) in radial directions of the line plating rollers (200) are 0.2 mm to 5 mm.

12. The manufacturing apparatus according to claim 8, wherein a plurality of electric contact points (220) are disposed in ends of the line plating rollers (200), the electric contact points (220) are disposed along edges of the line plating rollers (200), and the electric contact points (220) are all disposed to correspond and be electrically connected to the conductive parts (210) one to one; and electric contact points (220) corresponding to the deplating regions (201) are connected to a positive electrode end (710) of the power source, and electric contact points (220) corresponding to the line plating regions (202) are connected to a negative electrode region (730) of the power source.

13. The manufacturing apparatus according to claim 7, wherein the first driving member comprises a driving motor (230) of which an output shaft (231) is disposed to be concentric and connected to the line plating rollers (200); and the second driving member comprises driving rollers (300) which are disposed on a side of the cathode region (400) and are connected to the semiconductor device in a rolling way.

14. The manufacturing apparatus according to claim 7, wherein a circulation pipeline (100) used for stirring a plating solution in the plating solution region (500) is further disposed in the plating solution region (500).

15. The manufacturing apparatus according to claim 7, wherein the anode (600) comprises a metal plate, the semiconductor device comprises a silicon wafer (410) or battery slice, and the silicon wafer (410) or battery slice is disposed to be parallel or horizontal relative to the metal plate.

\* \* \* \* \*